United States Patent [19]

Shoji et al.

[11] Patent Number: 5,373,520
[45] Date of Patent: Dec. 13, 1994

[54] SURFACE EMITTING LASER AND METHOD OF MANUFACTURING THE SAME

[75] Inventors: Hajime Shoji; Koji Otsubo; Tatsuroh Ikeda; Manabu Matsuda; Hiroshi Ishikawa, all of Kawasaki, Japan

[73] Assignee: Fujitsu Limited, Kawasaki, Japan

[21] Appl. No.: 104,643

[22] Filed: Aug. 11, 1993

[30] Foreign Application Priority Data

Aug. 12, 1992 [JP] Japan .................................. 4-215233

[51] Int. Cl.$^5$ .............................................. H01S 3/19
[52] U.S. Cl. ...................................... 372/45; 372/46; 372/96; 437/129
[58] Field of Search ....................... 372/45, 46, 96, 99; 437/129

[56] References Cited

U.S. PATENT DOCUMENTS

| | | | |
|---|---|---|---|
| 5,038,356 | 8/1991 | Botez et al. | 372/45 |
| 5,208,820 | 5/1993 | Kurihara et al. | 372/45 |
| 5,226,053 | 7/1993 | Cho et al. | 372/45 |
| 5,229,627 | 7/1993 | Kosaka | 372/99 |
| 5,237,581 | 8/1993 | Asada et al. | 372/45 |

FOREIGN PATENT DOCUMENTS

| | | |
|---|---|---|
| 0142845 | 5/1985 | European Pat. Off. . |
| 01319983 | 12/1989 | Japan . |
| 02052486 | 2/1990 | Japan . |
| 04115588 | 4/1992 | Japan . |

OTHER PUBLICATIONS

Applied Physics Letters, vol. 57, No. 16, Oct. 15, 1990, New York, US, pp. 1605–1607, R. S. Geels, L. A. Coldren, 'Submilliamp Threshold Vertical–Cavity Laser Diodes'.
Journal of Applied Physics, vol. 69, No. 11, Jun. 1, 1991, New York, US, pp. 7430–7434, C. Lei et al., 'ZnSe/CaF2 Quarter-Wave Bragg Reflector for the Vertical–Cavity Surface–Emitting Laser'.
"CBE Grown 1.5 μm GaInAsP/InP Surface Emitting Lasers," T. Uchida et al., Technical Digest of 13th IEEE International Semiconductor Laser Conference L–2, Sep. 24, 1992, pp. 212–213.
"Submilliamp Threshold Vertical–Cavity Laser Diodes," R. Geels et al., Applied Physics Letters 57 (16), Oct. 15, 1990, pp. 1605–1607.
"High Power GaAs/AlGaAs Vertical Cavity Top-Surface-Emitting Lasers," K. Kojima et al., Technical Digest of 13th IEEE International Semiconductor Laser Conference PD–2, Sep. 24, 1992, pp. 3–4.
Geels et al., "Low Threshold Planarized Vertical-Cavity Surface Emitting Lasers," IEEE Photonics Technology Letters, vol. 2, No. 4, Apr. 1990, pp. 234–236.

Primary Examiner—Georgia Y. Epps
Attorney, Agent, or Firm—Staas & Halsey

[57] ABSTRACT

A current constriction layer surrounding a vertical-cavity region is formed in a cladding layer of a surface emitting laser. The forbidden band width of the material forming this current constriction layer is wider than the forbidden band width of a material forming the cladding layer. Further, the current constriction layer and the cladding layer are formed of semiconductors, and conduction types thereof are different from each other. Further, the upper surface of the cladding layer covering the current constriction layer has a step in the periphery of vertical-cavity region.

18 Claims, 4 Drawing Sheets

SURFACE EMITTING LASER AND METHOD OF MANUFACTURING THE SAME

BACKGROUND OF THE RELATED ART

1. Field of the Invention

The present invention relates to a surface emitting laser and a method of manufacturing the same.

2. Description of the Related Art

In a surface emitting laser, as an effective method for achieving a low threshold current, (1) a method of reducing a loss by increasing reflectivity of a reflecting film and (2) a method of improving current injection efficiency by constricting a region where a current flows so as to make a sectional area of an active layer very small are known. In general, high performance is aimed at by using these methods jointly.

In a method of realizing high reflectivity, a distributed Bragg reflector (DBR) mirrors are provided above and below a cavity, and very high reflectivity is obtainable by this method. The DBR mirror is composed of a semiconductor or dielectric multilayer film.

A following method is known as a typical method of constricting a current.

First, there is a method of burying a very small cavity in a semiconductor layer, which is reported in Technical Digest of 13th IEEE International Semiconductor Laser Conference, Sep. 24, 1992, pp. 212–213. Secondly, there is a method of forming a vertical-cavity having an active layer with a very small area by patterning a semiconductor film, and the techniques thereof are described in Applied Physics Letters, Vol. 57 No. 16, 15 Oct. 1990, pp. 1605–1607. Thirdly, a method of forming a high resistance layer by implanting hydrogen ions into a semiconductor layer around a cavity and surrounding the cavity by the high resistance layer has been reported in Technical Digest of 13th IEEE International Semiconductor Laser Conference, Sep. 24, 1992, pp. 3–4.

When a vertical-cavity is buried into a semiconductor layer, however, such a highly advanced technique that an opening is formed in a semiconductor layer and a cladding layer, an active layer or the like are laminated therein with high controllability is required, thus lowering yield.

Further, it is comparatively easy to form a vertical-cavity of a surface emitting laser through patterning by present dry etching techniques, but the side of the active layer is damaged by etching. As a result, carriers are caught by crystal defects of the side portion of the active layer, and not only the carriers contributing to emission are reduced, but also non-emitting recombination is increased in the active layer, thus resulting in lowering of emission efficiency.

Further, although the effect of current constriction is large in a surface emitting laser having a structure that a cavity is surrounded by a high resistance layer formed by ion implantation, controllability of constriction width is deteriorated by ion implantation, thus causing poor reliability.

SUMMARY OF THE INVENTION

It is an object of the present invention to provide a surface emitting laser in which yield is high, emission efficiency is high and control of a constricted region is easy and a method of manufacturing the same.

According to the present invention, a current constriction layer composed of a material having large forbidden band width is provided in a cladding layer of a surface emitting laser, and the region of the vertical-cavity is surrounded by the current constriction layer. Since the current constriction layer acts as an energy barrier, the current passing through the cladding layer flows in the cavity concentratedly.

Accordingly, it becomes unnecessary to apply patterning to the active region for current constriction, and crystal defects attendant upon patterning are not generated and lowering of emission efficiency by non-emitting recombination on the side portion of the cavity almost disappears. Further, the opening provided in the current constriction layer in order to apply a current to the cavity can be realized easily by a mask process, and the area thereof is strictly controlled to an optional size. Further, since the thickness of the current constriction layer is controlled with high accuracy by crystal growth, highly efficient current constriction is realized with high reproducibility. The current constriction becomes more conspicuous by making conduction types of the current constriction layer and layers above and below thereof different from each other.

Moreover, since the refractive index of the current constriction layer is made different from the refractive index of the cladding layer, the cavity length of the vertical-cavity itself surrounded by the current constriction layer becomes different from the cavity length in the vertical direction of the layer therearound, and oscillation of the vertical-cavity becomes easy, thus stabilizing the oscillation. Further, the effect thereof becomes more conspicuous by such a structure of the cladding layer laminated from on the current constriction layer to the inside of the opening that a step is provided around the opening.

Further, according to another invention, a portion located in the region around the cavity in the DBR mirror on the upper side is removed, and an electrode is formed at the removed portion. Therefore, the resistance is reduced by a large margin as compared with a structure in which an electrode is formed placing on the DBR mirror.

Furthermore, according to still another invention, since an etching stop semiconductor layer is formed under a semiconductor layer which becomes a current constriction layer and under the DBR mirror, the semiconductor layer forming the cavity will never becomes rough, thus reducing the loss when an opening is formed in the current constriction layer or patterning is applied to the DBR mirror.

Moreover, since the etching stop layer under the DBR mirror is made to have high impurity concentration, the contact resistance of an electrode formed directly on the etching stop layer becomes low, and current injection efficiency is improved.

DESCRIPTION OF THE PREFERRED EMBODIMENTS (First Embodiment)

A process of manufacturing a surface emitting laser according to a first embodiment of the present invention will be described hereinafter.

Figure 1A:
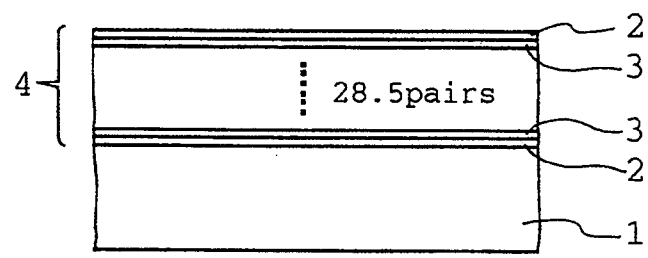
FIG. 1(a) to FIG. 1(e) are sectional views showing a process of manufacturing a surface emitting laser according to a first embodiment of the present invention.

First, as shown in FIG. 1(a), an n-AlAs layer 2 and an n-GaAs layer 3 are laminated in thickness of 83.1 nm and 69.6 nm, respectively, on an n-GaAs substrate 1 having Si content of $2 \times 10^{18}$ cm$^{-3}$ and a thickness of 100 μm by an organic metal chemical vapor deposition method, and a semiconductor DBR mirror 4 composed of 28.5 pairs of n-AlAs layer 2 and n-GaAs layer 3 is formed by forming a film by repeating the above process. The Si content of the n-AlAs layer 2 and the n-GaAs layer 3 in this case is $3 \times 10^{18}$ cm$^{-3}$, respectively.

Figure 1B:
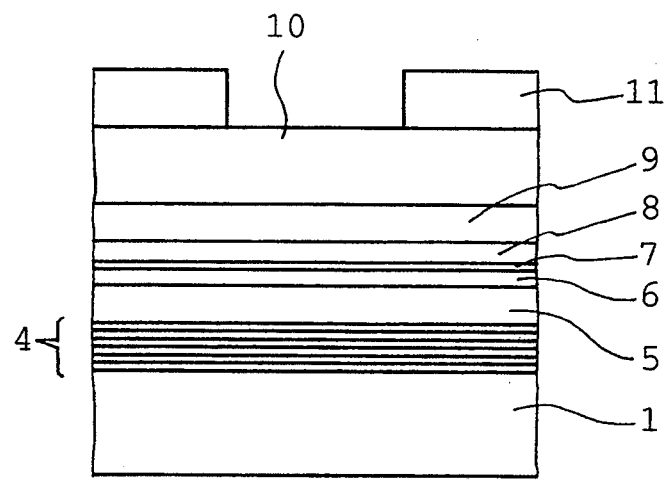

Then, as shown in FIG. 1(b), an n-Al$_{0.2}$Ga$_{0.8}$As cladding layer 5 having Si content of $2 \times 10^{18}$ cm$^{-3}$ and a thickness of 130 nm, a GaAs barrier layer 6 having a thickness of 10 nm, an In$_{0.2}$Ga$_{0.8}$As single quantum-well layer 7 having a thickness of 8 nm, a GaAs barrier layer 8 having a thickness of 10 nm and a p-Al$_{0.2}$Ga$_{0.8}$As cladding layer 9 having Zn content of $3 \times 10^{18}$ cm$^{-3}$ and a thickness of 130 nm are laminated, respectively, and an n-InGaP current constriction layer 10 having Si content of $2 \times 10^{18}$ cm$^{-3}$ is formed further in a thickness of 200 nm.

Figure 1C:
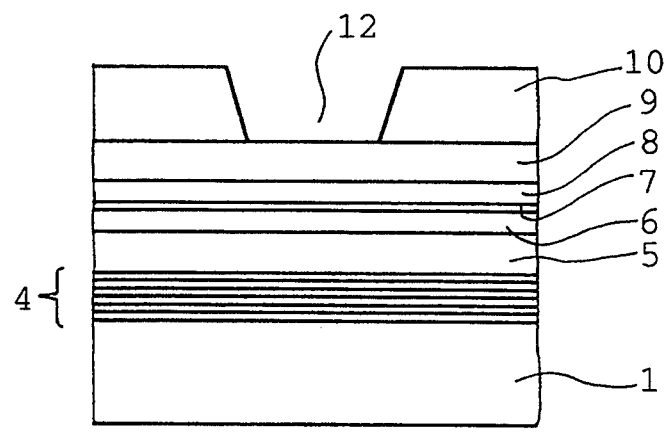

Next, as shown in FIG. 1(c), patterning is applied to the current constriction layer 10 with hydrochloric acid as an etchant using a mask 11 composed of SiO$_2$, thereby to form an opening 12 which becomes a current injection path. In this case, the etching rate for the p-Al$_{0.2}$Ga$_{0.8}$As cladding layer 9 is very small, thus producing selectively, and etching is stopped with high controllability after the opening 12 is formed.

Figure 1D:
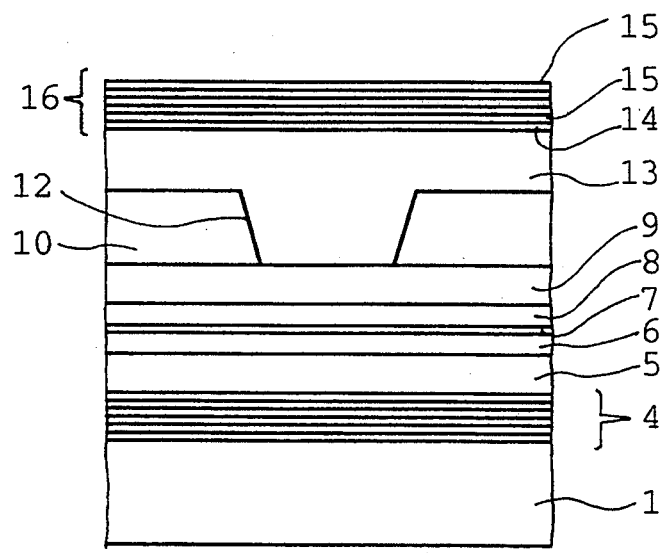

Thereafter, as shown in FIG. 1(d), a p-Al$_{0.2}$Ga$_{0.8}$As layer 13 having Zn content of $3 \times 10^{18}$ cm$^{-3}$ is grown flat on the p-Al$_{0.2}$Ga$_{0.8}$As cladding layer 9 and the current constriction layer 10 peeping from the opening 12, thereby to increase the thickness of the cladding layer 9. In this case, the thickness of the p-Al$_{0.2}$Ga$_{0.8}$As layer 13 in the opening 12 is set to 578 nm.

With this, the total thickness from the n-Al$_{0.2}$Ga$_{0.8}$As cladding layer 5 to the uppermost p-Al$_{0.2}$Ga$_{0.8}$As layer (cladding layer) 13 becomes three times of half wavelength, i.e., integer time N of $\lambda/2$, and the central position in the film thickness direction of the single quantum-well active layer is positioned at 0.5 times of the wavelength, i.e., integer times M(M<N) of $\lambda/2$ from the under surface of the n-Al$_{0.2}$Ga$_{0.8}$As layer. With this, the amplitude of an optional standing wave becomes the largest n the single quantum-well active layer, and the single quantum-well active layer 7 is positioned where light is most intense.

In succession, a p-AlAs layer 14 and a p-GaAs layer 15 are grown in thickness of 83.1 nm and 69.6 nm, respectively, and these layers are laminated repeatedly in 23 pairs alternately so as to form a semiconductor DBR mirror 16 on the upper side. These layers contain Zn at a concentration of $3 \times 10^{18}$ cm$^{-3}$. Besides, since p-AlAs is oxidized easily, the p-GaAs layer 15 is formed as the uppermost layer.

Figure 1E:
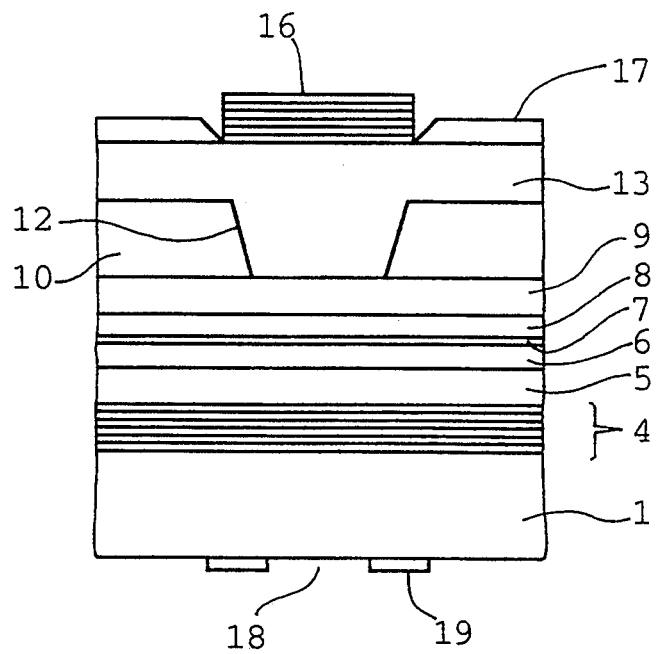
Figure 2:
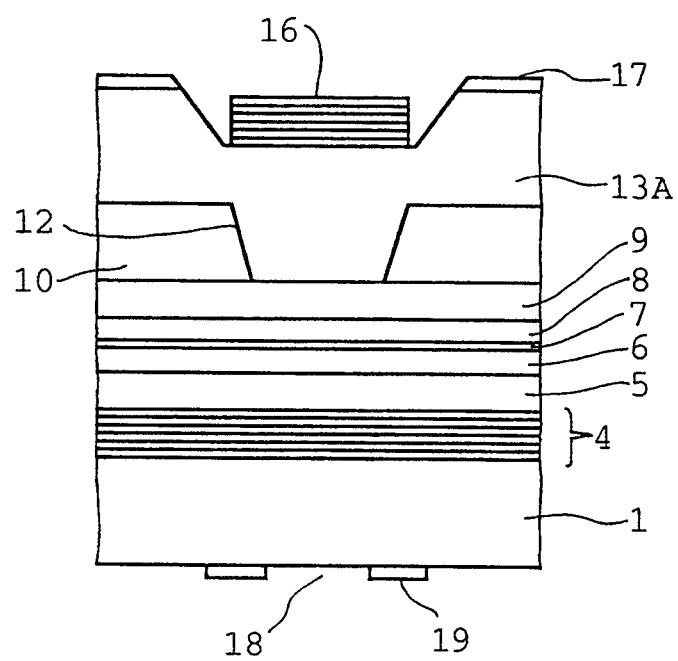
FIG. 2 is a sectional view showing a structure of a surface emitting laser according to a second embodiment of the present invention.
Figure 3:
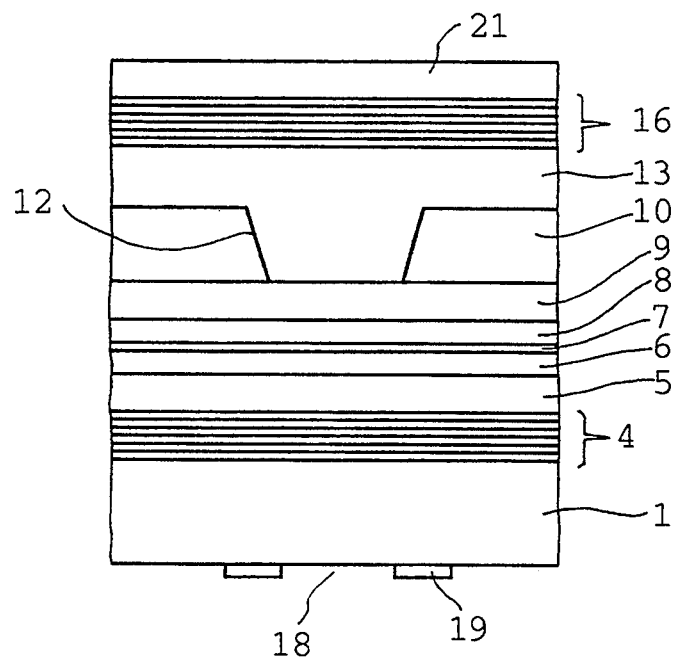
FIG. 3 is a sectional view showing a structure of a surface emitting laser according to a third embodiment of the present invention.
Figure 4:
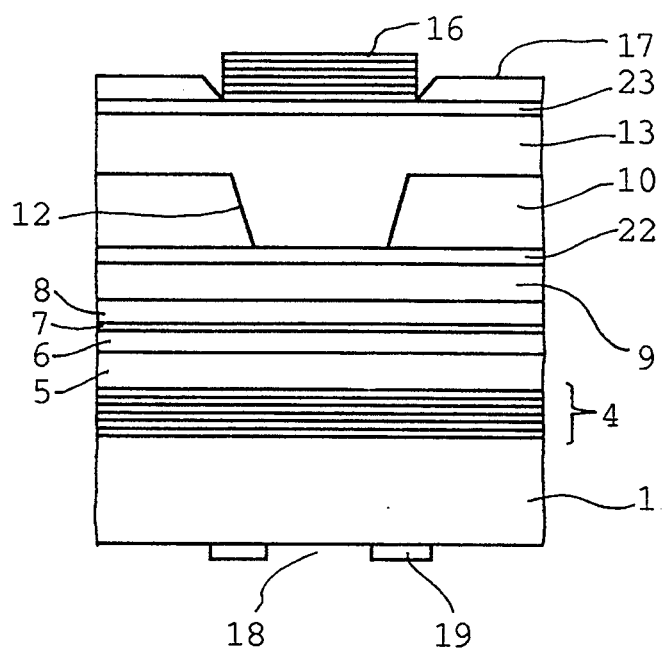
FIG. 4 is a sectional view showing a structure of a surface emitting laser according to a fourth embodiment of the present invention.

Next, patterning is applied to the DBR mirror 16 on the upper side by a dry etching method such as RIBE as shown in FIG. 1(e) using chloric system gas with SiO$_2$ not shown as a mask, thereby to leave the DBR mirror 16 only immediately above the opening 12 and in a little circumference therearound.

In succession, a three-layer shaped metallic film of Ti/Pt/Au is formed on the p-Al$_{0.2}$Ga$_{0.8}$As layer 13 around the DBR mirror 16 on the upper side, and a p-side electrode 17 is formed around the DBR mirror by applying patterning to the metallic film. Furthermore, an n-side electrode 19 composed of doughnut-shaped AuGe/Au provided with a hole 18 at a position below the opening 12 is formed on the under surface of the GaAs substrate 1.

With this, a surface emitting laser is completed. The cavity thereof is formed of a longitudinal semiconductor layer in the opening region surrounded by the current constriction layer 10.

When such a surface emitting laser is driven, a current is applied from the p-side electrode 17 toward the n-side electrode 19 to generate oscillation so as to emit light through the hole 18 of the n-type electrode 19. In this case, InGaP forming the current constriction layer 10 is a material having a wider forbidden band width than that of AlGaAs forming the cladding layer 9 therearound, and acts as an energy barrier layer, and moreover, the opening 12 is formed in the current path. Therefore, the current injected from the p-side electrode 17 flows through the opening 12 while being constricted, thus making it possible to obtain a low threshold current. Moreover, since the current constriction layer 10 is made into a p-type, and the upper and under cladding layers 9 and 13 are made into an n-type, an effect of current constriction by the npn junction is added, thus increasing the effect of concentrating the current flowing from the p-side electrode 17 to the vertical-cavity.

With the above, no crystal defect is produced on the side portion of the active layer 7, emission efficiency is hardly lowered due to non-emitting recombination or the like on the side portion. Further, the opening 12 can be realized easily by a mask process, the area thereof can be controlled strictly to an optional size, and the thickness of the current constriction layer 10 is controlled with high controllability by crystal growth. Thus, highly efficient current constriction can be realized with high reproducibility.

Moreover, since the refractive index of the current constriction layer 10 is larger than the refractive index of the cladding layers 9 and 13 having the composition described above, the cavity length of the vertical-cavity structured by the layers located in the opening 12 and above and below thereof becomes shorter than the cavity length of a parasitic cavity formed by the current constriction layer 10 and the layers above and below thereof. As a result, oscillation of the vertical-cavity located in the region surrounded by the current constriction layer 10 becomes easier, thus stabilizing oscillation.

Furthermore, in a structure in which a part of the upper DBR mirror 16 is removed and the p-side electrode 17 is formed therearound, the element resistance is largely reduced and the power consumption is restrained.

Now, when it is assumed that the oscillation wavelength of a semiconductor layer is $\lambda_0$, the wavelength $\lambda$ of the light advancing in the semiconductor layer becomes $\lambda = \lambda_0/n$ (n:refractive index of the semiconductor layer), and when it is assumed that the film thickness of the n-GaAs layer 3 and the n-AlAs layer 2 is $\lambda/4$, respectively, the period becomes $\lambda/2$, and a standing wave having the wavelength λ is formed by the DBR mirrors 4 and 16. Accordingly, when the n-AlAs layers 2 and 14 and the n-GaAs layers 3 and 15 are formed in the above-mentioned film thickness, the DBR mirror 4 is provided with selectivity of the wavelength of 980 nm, and the oscillation wavelength of the semiconductor laser becomes 0.98 μm.

Further, the reasons why the AlAs layer 2 and the GaAs layer 3 constituting the DBR mirror 4 on the lower side are formed in 28.5 pairs without forming them several integer times are for making the energy barrier is high so as to regulate the phase by forming the uppermost layer of the DBR mirror 4 with the n-AlAs layer 2, and for making the energy barrier around the active layer 7 high so as to improve confinement of electrons.

Besides, the above-mentioned active layer 7 is formed by a single quantum-well, but a multiple quantum-well may be formed by forming GaAs and InGaAs alternately into a plurality of layers. Further, the number of layers of the above-mentioned DBR mirrors 4 and 16 is not limited to 28.5 pairs and 23 pairs.

(Second Embodiment)

When the p-$Al_{0.2}Ga_{0.8}As$ layer 13 constituting the cladding layer on the upper side is formed, the upper surface thereof is made flat in the first embodiment, but the layer 13 may also be formed to have an almost uniform thickness along the top of the current constriction layer 10 and the inside of the opening 12.

Since a step is produced in the vicinity of the opening 12 in the p-$Al_{0.2}Ga_{0.8}As$ layer 13A with such a structure, the difference between the cavity length of the vertical-cavity formed in the region in the vertical direction passing through the opening 12 and the cavity length of the cavity structured by the semiconductor layer therearound gets larger. As a result, oscillation of the vertical-cavity is stabilized further.

Besides, the flatness of the upper surface of the p-$Al_{0.2}Ga_{0.8}As$ layer 13A which becomes the cladding layer can be controlled by varying a growth temperature and a gas flow rate when the layer is formed by a MOCVD method.

(Third Embodiment)

In the above-mentioned embodiments, the p-electrode 17 is provided around the DBR mirror 16 on the side farther from the GaAs substrate 1, but a p-electrode 21 may also be formed directly thereon without applying patterning to the DBR mirror 16. In this case, although the resistance between the p-electrode 21 and the n-electrode 19 is increased by the DBR mirror 16, there is an advantage that the manufacturing process becomes simple. As a current flowing region is limited by the current constriction layer, a size of the electrode give no influence.

(Fourth Embodiment)

The current constriction layer 10 is formed directly on the p-$Al_{0.2}Ga_{0.8}As$ cladding layer 9 and then the opening 12 is formed in the above-mentioned embodiment, but a p-GaAs etching stop layer 22 having Zn content of $3 \times 10^{18}$ cm$^{-3}$ may be interposed in a thickness of several nm to 10 nm having little photoabsorption between the p-$Al_{0.2}Ga_{0.8}As$ cladding layer 9 and the current constriction layer 10. Further, a p-GaAs layer 23 having a film thickness of 69.6 nm doped with Zn at a high concentration ($1 \times 10^{18}$ cm$^{-3}$) may be interposed between the DBR mirror 16 on the upper side and the p-$Al_{0.2}Ga_{0.8}As$ layer 13 thereunder.

Since GaAs is harder to be etched by hydrochloric acid than AlGaAs, the labor of etching control when patterning is applied to the current constriction layer 10 and the DBR mirror 16 is reduced further. Moreover, according to the p-GaAs layer 23 having high impurity concentration, the contact resistance of the p-side electrode 17 is reduced, and an oxidation of the p-$Al_{0.2}Ga_{0.8}As$ layer 13 on the current constriction layer 10 is prevented. Besides, since the film thickness of the p-GaAs layer 23 having high impurity concentration is 69.6 nm, a part of the DBR mirror 16 is formed.

(Other Embodiments)

The DBR mirror 16 on the upper side is formed of a compound semiconductor multilayer film in the above-mentioned embodiment, but it is also possible to form it by a dielectric multilayer film composed of $SiO_2$ and Si for instance.

Besides, a material of InGaAs/GaAs system has been described in the above-mentioned embodiment, but it is also possible to execute the present invention using a material of GaAs/AlGaAs system or InGaAs/InGaAsP system.

What is claimed is:

1. A surface emitting laser comprising:
    a first DBR mirror composed of a semiconductor multilayer film formed on a semiconductor substrate;
    a first cladding layer formed on said first DBR mirror;
    an active region layer formed on said first cladding layer;
    a second cladding layer formed above said active region layer;
    a current constriction layer formed on said second cladding layer and composed of a semiconductor material having a wider forbidden band than those of said active region layer and said second cladding layer;
    an opening formed in said current constriction layer;
    a third cladding layer formed in said opening and on said current constriction layer and composed of a semiconductor material having a narrower forbidden band than said current constriction layer;
    a second DBR mirror composed of a multilayer film formed on said third cladding layer; and
    a first electrode and a second electrode to pass current between said first and third cladding layers.

2. A surface emitting laser according to claim 1, wherein the upper surface of said third cladding layer has a step between the region above said current constriction layer and the region above said opening.

3. A surface emitting laser according to claim 1, wherein said active region layer has a single quantum-well structure.

4. A surface emitting laser according to claim 1, wherein said active region layer has a multiple quantum-well structure.

5. A surface emitting laser according to claim 1, wherein said second DBR mirror is formed of a semiconductor multilayer film.

6. A surface emitting laser according to claim 1, wherein said second and third cladding layers are composed of a first conduction type semiconductor and said current constriction layer is composed of a second conduction type semiconductor.

7. A surface emitting laser according to claim 1, wherein said second DBR mirror exists directly above said opening, and said second electrode is formed on the upper surface of said third cladding layer therearound.

8. A surface emitting laser according to claim 7, wherein an impurity containing semiconductor layer is interposed between said second electrode and said third cladding layer.

9. A surface emitting laser according to claim 1, wherein said first electrode is formed into a ring-shape at a portion corresponding to a region surrounding said opening on the underside of said semiconductor substrate.

10. A surface emitting laser according to claim 1, wherein said semiconductor substrate is composed of GaAs, said first DBR mirror is composed of a multilayer film in which AlAs and GaAs are laminated alternately, said first cladding layer is composed of AlGaAs, said active region layer is composed of a quantum-well layer having a GaAs barrier layer and an InGaAs well layer, said second and third cladding layers are composed of AlGaAs, said current constriction layer is composed of InGaP, and said second DBR mirror is composed of a multilayer film in which AlAs and GaAs are laminated alternately.

11. A method of manufacturing a surface emitting laser comprising the steps of:
    forming a first DBR mirror by laminating a semiconductor multilayer film on a semiconductor substrate;
    laminating a first cladding layer on said first DBR mirror;
    forming an active region layer on said first cladding layer;
    laminating a second cladding layer above said active region layer;
    forming a current constriction layer having a wider forbidden band than those of said active region layer and said second cladding layer and composed of a material which is etched selectively for said second cladding layer;
    forming an opening which becomes a current path by applying patterning to said current constriction layer;
    forming a third cladding layer on said current constriction layer and said second cladding layer exposed in said opening;
    forming a multilayer film constituting said second DBR mirror on said third cladding layer; and
    forming a first electrode and a second electrode to pass current between said first and third cladding layers.

12. A method of manufacturing a surface emitting laser according to claim 11, further comprising the step of interposing an etching stop layer between said second cladding layer and said current constriction layer.

13. A method of manufacturing a surface emitting laser according to claim 11, further comprising the step of forming said second DBR mirror of a semiconductor multilayer film.

14. A method of manufacturing a surface emitting laser according to claim 11, further comprising the steps of, after laminating said multilayer film constituting said second DBR mirror, applying patterning to said multilayer film so as to have it remain immediately above said opening, and forming said second electrode connected to the upper surface of said third cladding layer around said multilayer film applied with patterning.

15. A method of manufacturing a surface emitting laser according to claim 14, further comprising the step of interposing an etching stop semiconductor layer of high impurity content having a film thickness of $\frac{1}{4}$ wavelength between said multilayer film constituting said second DBR mirror and said second cladding layer.

16. A surface emitting laser according to claim 1, wherein said second electrode is formed on said second DBR mirror.

17. A surface emitting laser according to claim 1, wherein said second DBR mirror is formed of a dielectric multilayer film.

18. A method of manufacturing a surface emitting laser according to claim 11, further comprising the step of forming said second DBR mirror of a dielectric multilayer film.

* * * * *

UNITED STATES PATENT AND TRADEMARK OFFICE
CERTIFICATE OF CORRECTION

PATENT NO. : 5,373,520
DATED : December 13, 1994
INVENTOR(S) : Shoji et al

Page 1 of 2

It is certified that error appears in the above-indentified patent and that said Letters Patent is hereby corrected as shown below:

Col. 3, lines 8, 14, and 16, delete "n-$AlA_s$" and insert --n-$A\ell A_s$--.

lines 18, 23, 34, 37, 39, 42, 44, 45, and 51, "n-$Al_{0.2}Ga_{0.8}As$" should be --n-$A\ell_{0.2}Ga_{0.8}As$-- lines 56 and 61, delete "p-$AlA_s$" and insert --n-$A\ell A_s$--.

Col. 4, line 4, "p-$Al_{0.2}Ga_{0.8}As$" should be --n-$A\ell_{0.2}Ga_{0.8}As$-- line 67, delete "n-$AlA_s$" and insert --n-$A\ell A_s$--.

Col. 5, lines 2 and 13, delete "n-$AlA_s$" and insert --n-$A\ell A_s$-- line 8, delete "$AlA_s$" and insert --$A\ell A_s$--

Col. 7, lines 15 and 22, delete "AlAs" and insert --$A\ell$As--.

lines 16 and 20, delete "AlGaAs" and insert --$A\ell$GaAs--.

UNITED STATES PATENT AND TRADEMARK OFFICE
CERTIFICATE OF CORRECTION

PATENT NO. : 5,373,520
DATED : December 13, 1994
INVENTOR(S) : Shoji et al.

It is certified that error appears in the above-indentified patent and that said Letters Patent is hereby corrected as shown below:

Col. 5, lines 24, 31, 39, 57, 62 and 67, "$-Al_{0.2}Ga_{0.8}As$" should be --$n-A\ell_{0.2}Ga_{0.8}As$-- line 38, delete "p-".

Col 6, line 7, delete "$p-Al_{0.2}-$"

line 8, delete "$Ga_{0.8}As$" and insert --$p-A\ell_{0.2}Ga_{0.8}As$-- line 21, delete "GaAs/AlGaAs" and insert --GaAs/A$\ell$GaAs--.

Signed and Sealed this

Fourth Day of July, 1995

Attest:

Attesting Officer

BRUCE LEHMAN

Commissioner of Patents and Trademarks